(12) United States Patent
von Malm et al.

(10) Patent No.: US 9,112,089 B2
(45) Date of Patent: Aug. 18, 2015

(54) SEMICONDUCTOR CHIP, DISPLAY COMPRISING A PLURALITY OF SEMICONDUCTOR CHIPS AND METHODS FOR THE PRODUCTION THEREOF

(75) Inventors: Norwin von Malm, Nittendorf (DE); Alexander Linkov, Regensburg (DE); Norbert Linder, Shanghai (CN)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/008,638

(22) PCT Filed: Jan. 30, 2012

(86) PCT No.: PCT/EP2012/051446
§ 371 (c)(1),
(2), (4) Date: Nov. 20, 2013

(87) PCT Pub. No.: WO2012/130499
PCT Pub. Date: Oct. 4, 2012

(65) Prior Publication Data
US 2014/0061667 A1  Mar. 6, 2014

(30) Foreign Application Priority Data

Mar. 31, 2011  (DE) .......................... 10 2011 015 726

(51) Int. Cl.
*H01L 33/60* (2010.01)
*H01L 33/10* (2010.01)
(Continued)

(52) U.S. Cl.
CPC .............. *H01L 33/10* (2013.01); *H01L 27/156* (2013.01); *H01L 33/32* (2013.01); *H01L 33/46* (2013.01); *H01L 33/60* (2013.01); *H01L 33/405* (2013.01); *H01L 33/50* (2013.01); *H01L 33/58* (2013.01)

(58) Field of Classification Search
None
See application file for complete search history.

(56) References Cited

U.S. PATENT DOCUMENTS 6,261,859 B1  7/2001  Ouchi
2003/0209714 A1  11/2003  Taskar et al.
(Continued)

FOREIGN PATENT DOCUMENTS

DE         199 43 405 A1    5/2001
DE  10 2008 051 050 A1    4/2010
(Continued)

OTHER PUBLICATIONS

Gelest Silicone Fluids: Stable Inert Media, 1998, Gelest, Inc., total pages 27.*
(Continued)

*Primary Examiner* — Kimberly Rizkallah
*Assistant Examiner* — Bo Bin Jang
(74) *Attorney, Agent, or Firm* — DLA Piper LLP (US)

(57) ABSTRACT

An optoelectronic semiconductor chip including a semiconductor body of semiconductor material, an outcoupling face arranged downstream of the semiconductor body in an emission direction and a mirror layer, wherein the semiconductor body includes an active layer that generates radiation, the mirror layer is arranged on the side of the semiconductor body remote from the outcoupling face, and a gap between the active layer and the mirror layer is set such that radiation emitted by the active layer towards the outcoupling face interferes with radiation reflected at the mirror layer such that the semiconductor chip features an emitted radiation pattern with a selected direction in the forward direction.

13 Claims, 5 Drawing Sheets

(51) Int. Cl.
- H01L 27/15 (2006.01)
- H01L 33/46 (2010.01)
- H01L 33/32 (2010.01)
- *H01L 33/40* (2010.01)
- *H01L 33/50* (2010.01)
- *H01L 33/58* (2010.01)

(56) References Cited

U.S. PATENT DOCUMENTS

| | | |
|---|---|---|
| 2006/0147148 A1 | 7/2006 | Wang et al. |
| 2007/0081569 A1 | 4/2007 | Kwon et al. |
| 2007/0297750 A1 | 12/2007 | Bass et al. |
| 2008/0142780 A1 | 6/2008 | Bader et al. |
| 2009/0154516 A1 | 6/2009 | Chua et al. |
| 2010/0117997 A1 | 5/2010 | Haase |
| 2011/0027921 A1* | 2/2011 | Hamasaki et al. ............ 438/26 |

FOREIGN PATENT DOCUMENTS

| | | |
|---|---|---|
| EP | 1 406 315 A2 | 4/2004 |
| JP | 11-510968 | 9/1999 |
| JP | 2004-56010 | 2/2004 |
| JP | 2005-79595 | 3/2005 |
| JP | 2006-60245 | 3/2006 |
| JP | 2007-116139 | 5/2007 |
| JP | 2008-277651 | 11/2008 |
| JP | 2009-88299 | 4/2009 |
| TW | 200847490 | 12/2008 |
| WO | 00/24024 | 4/2000 |
| WO | 2005/101531 A2 | 10/2005 |

OTHER PUBLICATIONS

Sanford et al., Refractive index and birefringence of InxGa1-xN films grown by MOCVD, 2005, phys. stat. sol. (c) 2, No. 7, pp. 2783-2786.*

Song, Y. K., et al., "Resonant-cavity InGaN quantum-well light-emitting diodes," Applied Physics Letters vol. 77, No. 12, Sep. 18, 2000, pp. 1744-1746.

Project Chelsea, 3M Corporate Development, Nov. 23, 2009, 9 pages.

English translation of Japanese Notice of Reasons for Rejection dispatched Oct. 7, 2014 from corresponding Japanese Patent Application No. 2014-500298.

Taiwanese Examination Report dated Mar. 10, 2014 for corresponding Taiwanese Application No. 101110964.

* cited by examiner

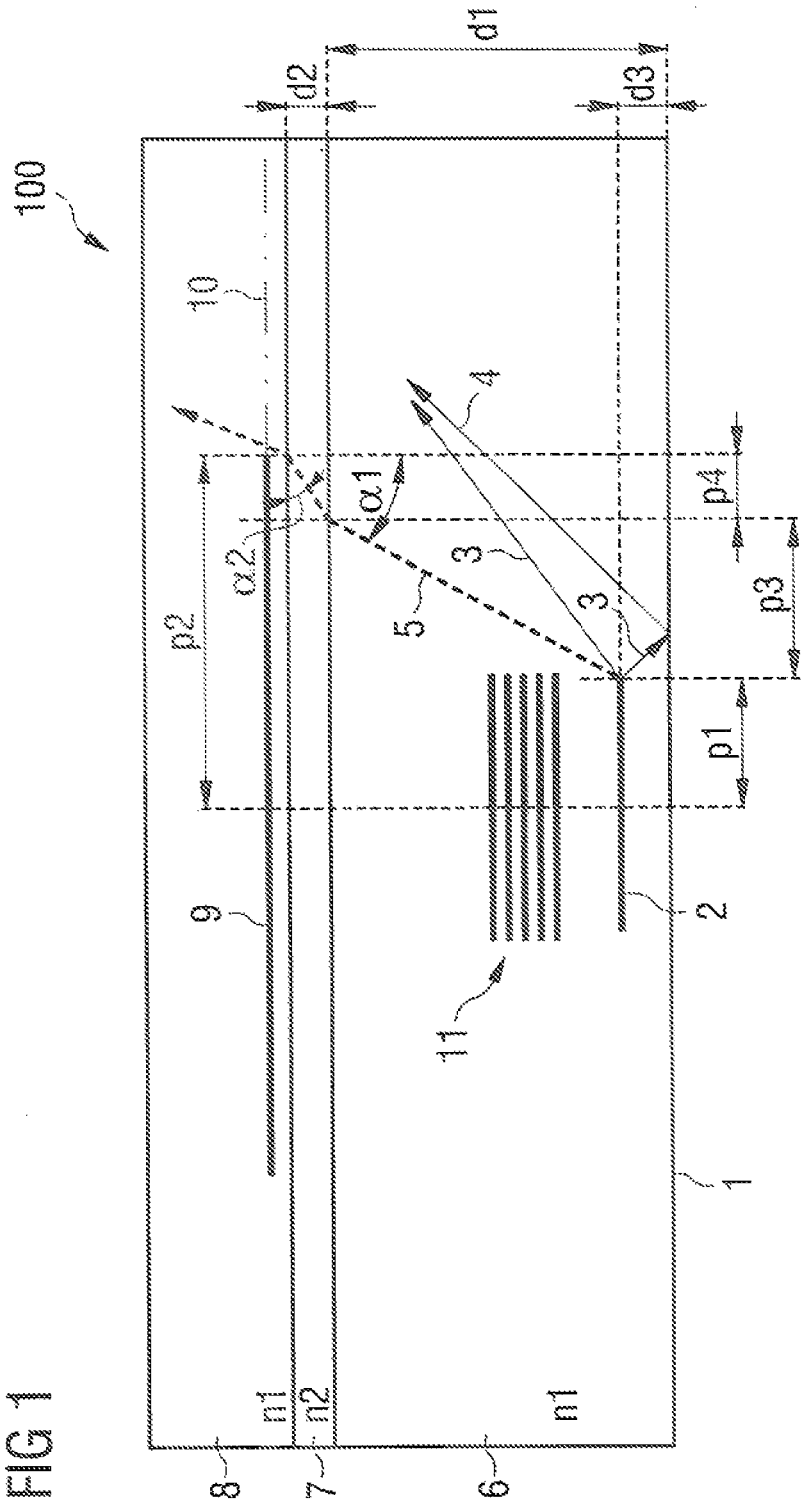

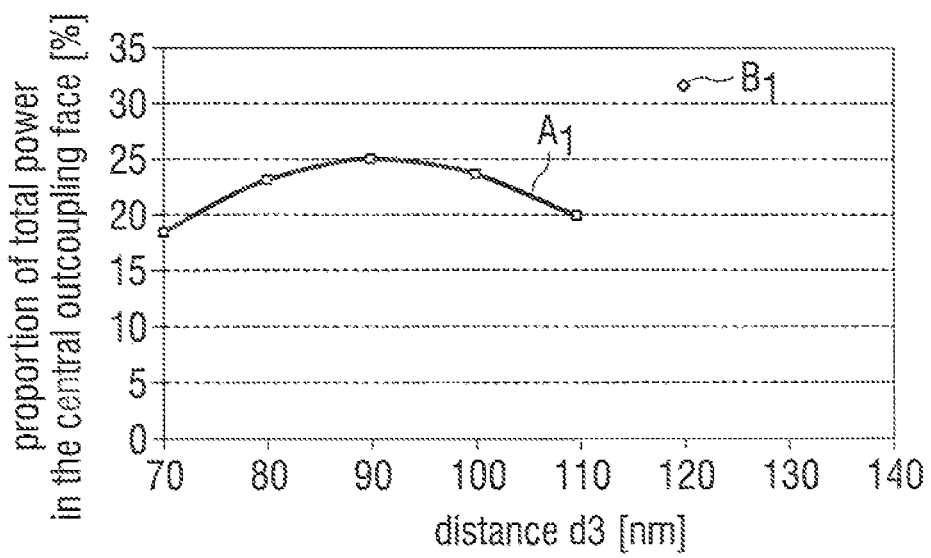
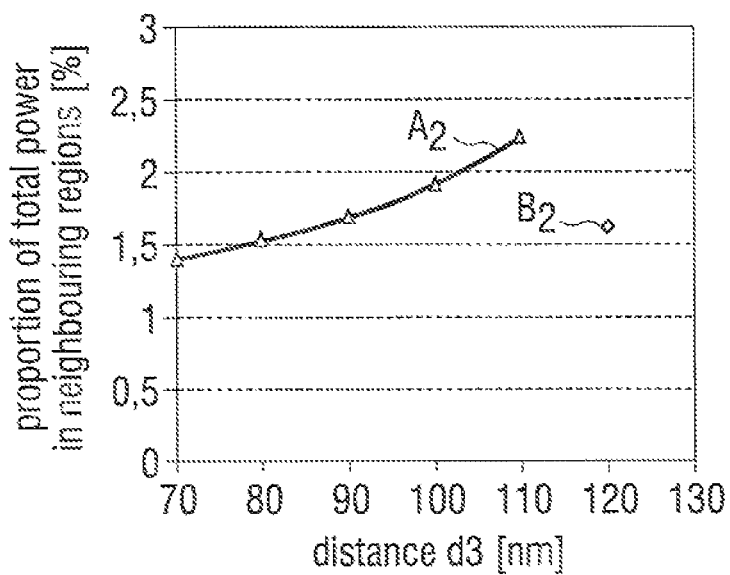

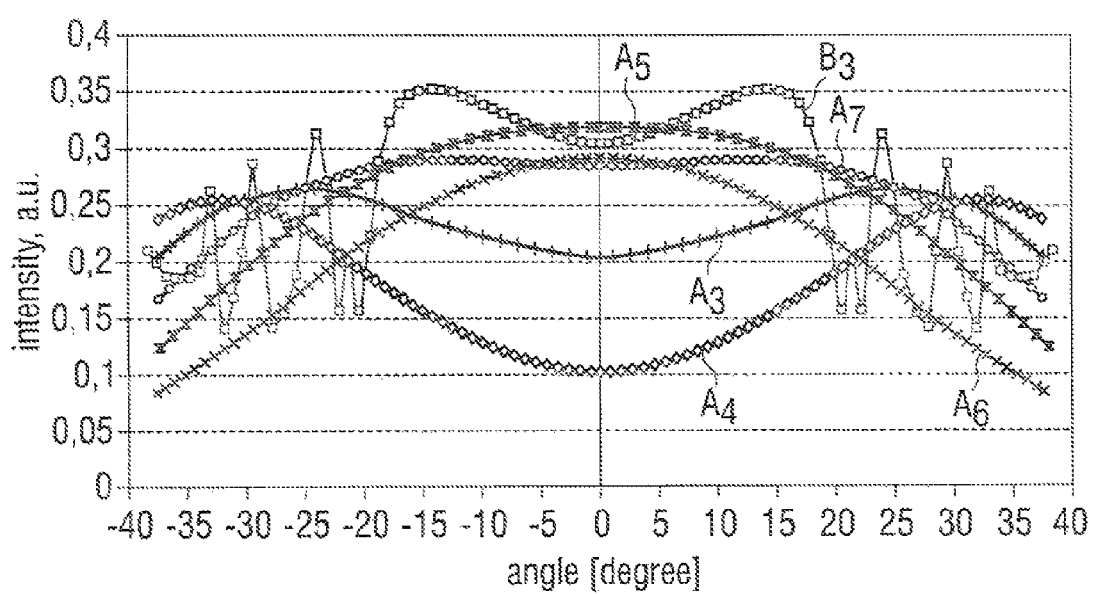

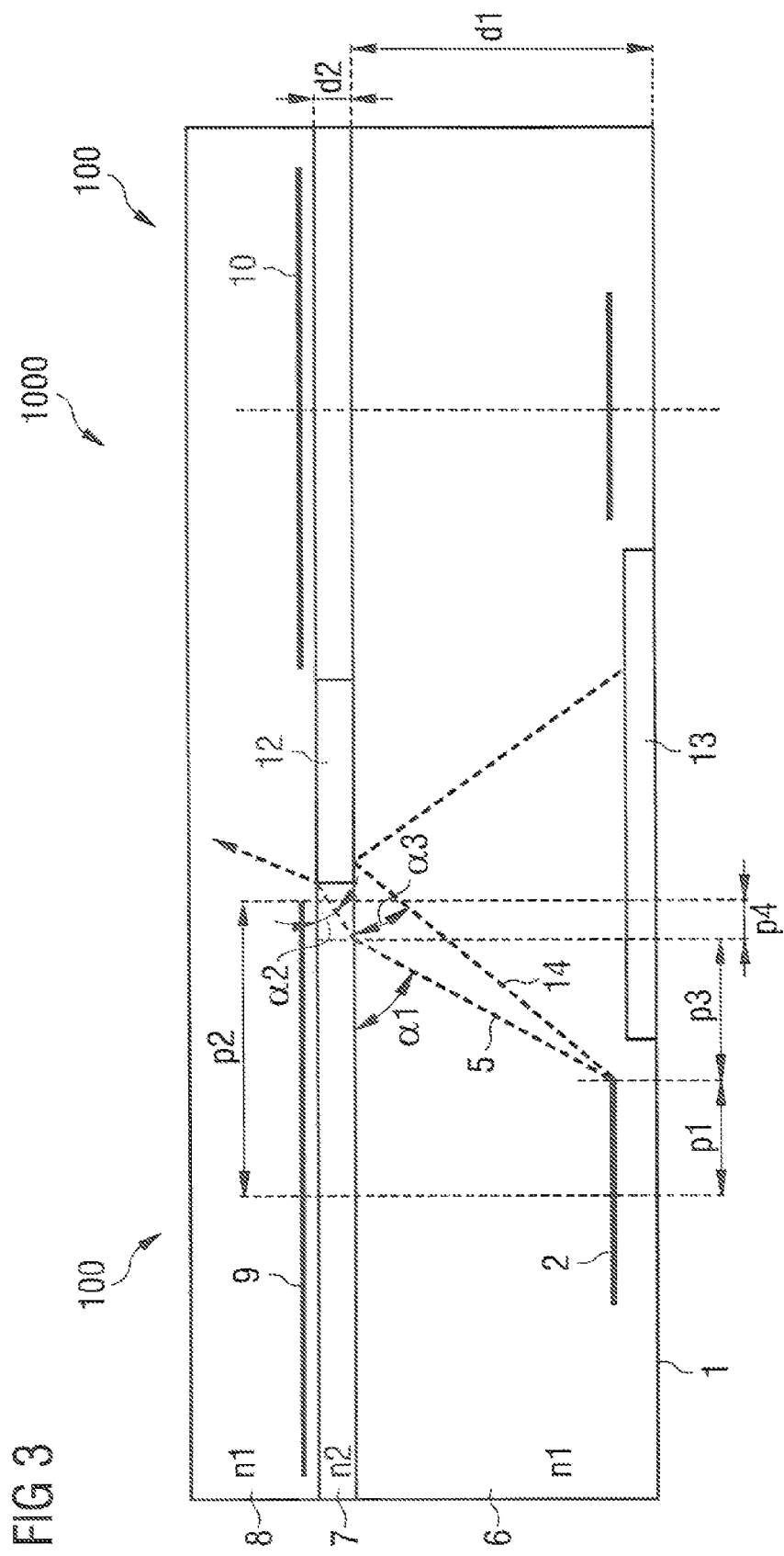

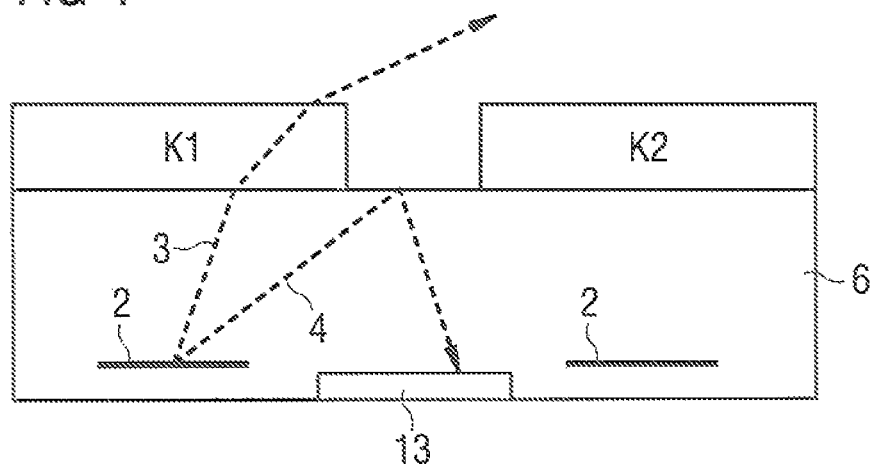
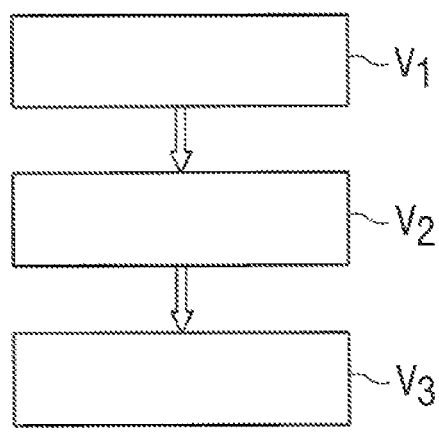

SEMICONDUCTOR CHIP, DISPLAY COMPRISING A PLURALITY OF SEMICONDUCTOR CHIPS AND METHODS FOR THE PRODUCTION THEREOF

RELATED APPLICATIONS

This is a §371 of International Application No. PCT/EP12/51446 with an international filing date of Jan. 30, 2012, which is based on German Application No. 102011015726.3, filed Mar. 31, 2011, the subject matter of which is incorporated by reference.

TECHNICAL FIELD

This disclosure relates to an optoelectronic semiconductor chip comprising a semiconductor body, a display comprising a plurality of semiconductor chips and methods of production thereof.

BACKGROUND

Semiconductor chips for use, for example, in beamers or projectors, which are connected with an image-generating element, are already known, an LCD (liquid crystal display) or a DLP (digital light processor) being used, for example, as the image-generating elements. A combination of such semiconductor chips with the image-generating elements is, however, inefficient due to optical losses and requires a large component height in the direction of the beam path.

A more efficient and compact approach is to embody semiconductor chips and image-generating elements in one component. A disadvantage of the latter case, however, is the problem that radiation from an emitting semiconductor chip enters a neighboring, optionally disconnected, semiconductor chip and is outcoupled there. This disadvantageously reduces the contrast of such components.

It could therefore be helpful to provide a semiconductor chip in which radiation outcoupling in the lateral direction is prevented, thereby advantageously in increased efficiency in the forward direction. It could additionally be helpful to provide a display comprising a plurality of semiconductor chips in which uncoupling of emitted radiation of one semiconductor chip into a neighboring semiconductor chip is prevented such that the display is distinguished by enhanced contrast. It could further be helpful to provide a production method for such a semiconductor chip and such a display.

SUMMARY

We provide a optoelectronic semiconductor chip including a semiconductor body of semiconductor material, an outcoupling face arranged downstream of the semiconductor body in an emission direction and a mirror layer, wherein the semiconductor body comprises an active layer that generates radiation, the mirror layer is arranged on the side of the semiconductor body remote from the outcoupling face, and a gap between the active layer and the mirror layer is set such that radiation emitted by the active layer towards the outcoupling face interferes with radiation reflected at the mirror layer such that the semiconductor chip features an emitted radiation pattern with a selected direction in the forward direction.

We also provide a display including a plurality of the optoelectronic semiconductor chips laterally arranged next to one another.

We further provide a method of producing a semiconductor chip including providing a semiconductor body of semiconductor material which comprises an active layer that generates radiation, arranging a mirror layer on the semiconductor body, wherein a gap between the active layer and the mirror layer is set such that radiation emitted by the active layer towards the outcoupling face interferes with radiation reflected at the mirror layer such that an emission pattern of the emitted radiation of the semiconductor chip is generated with a selected direction in the forward direction, and arranging a potting material on the semiconductor body, the potting material having a refractive index less than the refractive index of the semiconductor material, which satisfies:

$$p_2 = p_1 * (d_1 - d_3) * \tan(a \sin(n_2/n_3)) + d_2 * \tan(d_2),$$

wherein $p_1$ is a half value of the energized active layer, $p_2$ half value of the outcoupling face, $d_1$ height of the semiconductor body, $d_2$ height of the potting material, $d_3$ the gap between the active layer and the mirror layer, $n_1$ the refractive index of the semiconductor material and $n_2$ the refractive index of the potting material, with $0 \leq \alpha_2 < 90°$.

BRIEF DESCRIPTION OF THE DRAWINGS

FIG. 1 shows a schematic cross section of an example of our semiconductor chips.

FIGS. 2A to 2C each show a schematic diagram relating to outcoupling efficiency as a function of the gap between active layer and mirror-layer and the emission pattern as a function of the emission angle.

FIGS. 3 and 4 each show a schematic cross section of an example of our displays.

FIG. 5 is a flow chart relating to our production methods for a semiconductor chip.

DETAILED DESCRIPTION

Our semiconductor chip may comprise a semiconductor body of semiconductor material, an outcoupling face arranged downstream of the semiconductor body in the direction of emission and a mirror layer, the semiconductor body comprising an active layer that generates radiation. The mirror layer is arranged on the side of the semiconductor body remote from the outcoupling face. The gap between the active layer and the mirror layer is set such that radiation emitted by the active layer towards the outcoupling face interferes with radiation reflected at the mirror layer such that the semiconductor chip features an emitted radiation pattern with a preferred direction in the forward direction. The mirror layer may be a metal layer, for example, of silver. The outcoupling face and/or the mirror layer may be planar in form.

An optoelectronic semiconductor chip is in particular a semiconductor chip which allows the conversion of electronically generated data or energy into light emission or vice versa. The optoelectronic semiconductor chip is for example, a radiation-emitting semiconductor chip.

The radiation pattern describes the angle dependence of the light intensity relative to the intensity in a main emission direction. The main emission direction is here the vertical direction relative to the lateral extent of the active layer or of the semiconductor chip.

In this case, the gap between the active layer and the mirror layer is such that radiation emitted by the semiconductor chip is directed more strongly in the forward direction, i.e. more strongly in the main emission direction, in particular vertically relative to the lateral extent of the active layer. The gap between the active layer and the mirror layer is preferably set such that the radiant intensity is at its maximum in the forward direction. Radiation emission to the side of the active layer or of the semiconductor chip is then reduced, preferably stopped, due to the gap set. The semiconductor chip thus does not have a Lambertian radiation pattern. Such an alignment is also known as "beam shaping".

The preferred direction in the forward direction is produced inter alia by resonance. In the semiconductor body, an intensity distribution forms which advantageously allows radiation emission of the semiconductor chip in the forward direction, i.e. in a direction perpendicular to the lateral extent of the semiconductor chip, in particular in the main emission direction.

A potting material may be arranged on the semiconductor body, which material has a refractive index lower than the refractive index of the semiconductor material. A jump in retractive index at the outcoupling face of the semiconductor body is thus comparatively small.

The semiconductor chip need not be a laser, but rather a light-emitting diode, in particular a "Resonant Cavity Light-emitting Diode" or RC-LED for short. A coherence length of the emitted radiation is then comparatively small.

The radiation emitted from the semiconductor chip is preferably coupled out substantially through the outcoupling face of the semiconductor chip. Preferably 80% of the radiation emitted in the active layer, particularly preferably 90% of the radiation emitted by the active layer is coupled out of the semiconductor chip through the outcoupling face.

The mirror layer may preferably additionally serve as a p-contact of the semiconductor chip. N-contacting of the semiconductor chip may likewise proceed at the opposite side of the semiconductor chip from the outcoupling face. For example, the n-contact is arranged in an electrically insulated manner on the side of the mirror layer remote from the semiconductor chip and is passed by electrically insulated holes, or "vias", through the mirror to the n-side of the semiconductor chip. Alternatively, the n-contact may be arranged on the outcoupling side of the semiconductor chip between the semiconductor body and the potting material. In this case, the n-contact is preferably a radiation-transmissive layer, for example, comprising TCO, or configured as a metal grid contact.

The outcoupling face may have a lateral extent less than a lateral extent of the semiconductor body. The semiconductor body in particular comprises a major face arranged opposite the mirror layer, the major face comprising the outcoupling face in places. The outcoupling face is here preferably arranged centrally in the major face. This means in particular that in peripheral regions of the major face arranged next to the outcoupling face, substantially no radiation is coupled out. Preferably, at most 10% of the radiation emitted by the active layer is coupled out in the peripheral regions.

In plan view onto the semiconductor chip, the semiconductor chip accordingly comprises a major face which comprises a plurality of regions or "pixels". A pixel, for example, comprises the outcoupling face, neighboring pixels being arranged laterally adjacent the outcoupling face, through which pixels advantageously no or hardly any radiation is coupled out.

The following formula may apply:

$$p_2 = p_1 * (d_1 - d_3) * \tan(a \sin(n_2/n_1)) + d_2 * \tan(\alpha_2),$$

wherein $p_1$ is the half value of the energized active layer, $p_2$ the half value of the outcoupling face, $d_1$ the height of the semiconductor body, $d_2$ the height of the potting material, $d_3$ the gap between the active layer and the mirror layer, $n_1$ the refractive index of the semiconductor material and $n_2$ the refractive index of the potting material, with $0 \leq \alpha_2 < 90°$.

The half value here corresponds to half the lateral extent.

If the energized active layer has a half value $p_1$, the ideal minimum half value of the associated outcoupling face $p_2$ may then be calculated using the above-stated formula. The contrast of the semiconductor chip is limited inter alia by an indeterminacy of $d_2 * \tan(\alpha_2)$, since with a large angle $\alpha_2$ tan ($\alpha_2$) tends to infinity. This means that contrast cannot be of any desired magnitude since some of the radiation is always coupled out adjacent the outcoupling face. In addition, Fresnel reflections arise at the boundary surfaces between the material of the semiconductor body and the potting material such that reflected light is reflected back into the semiconductor body, there reflected at the mirror layer, and thus coupled out through regions adjacent the outcoupling face.

A Bragg mirror may be arranged between the active layer and the outcoupling face. The Bragg mirror preferably consists of $\lambda/4$ layers, for example, five $\lambda/4$ layers. The Bragg mirror preferably comprises $Al_xGa_{(1-x)}N$ and GaN layers. The Bragg mirror arranged in this way advantageously significantly increases the beam shaping effect and thus the efficiency of the semiconductor chip. In particular, the Bragg mirror amplifies radiation emission in the forward direction.

The Bragg mirror advantageously allows an increase in intensity for the rays emitted in the forward direction and a reduction in intensity for the rays emitted in the lateral direction.

The outcoupling face and the semiconductor body have a vertical axis of symmetry, the axis of symmetry of the active layer and the axis of symmetry of the outcoupling face preferably lying directly over one another. The Bragg mirror is advantageously arranged such that an axis of symmetry of the Bragg mirror coincides with the axis of symmetry of the active layer and the axis of symmetry of the outcoupling face. The Bragg mirror is preferably integrated into the semiconductor body.

Alternatively, the semiconductor body may be free of a mirror such as the Bragg mirror. In particular, no interlayer designed to reflect is then located between the active layer and the outcoupling face. The reflectivity of the outcoupling face may then be, for example, 20% to 60% of 25% to 50%. Such low reflectivity may in particular be achieved by the potting material.

A conversion layer may be applied to the side of the potting material remote from the semi conductor body. The conversion layer preferably comprises a transparent ceramic or semiconductor material, for example, II/VI semiconductor material.

The conversion layer preferably does not comprise any scattering centers such as, for example, converter particles. Alternatively, the conversion layer comprises a matrix material with converter particles embedded therein, the refractive index of the converter particles and the refractive index of the matrix material being the same such that no scattering centres are formed by the converter particles.

The conversion layer converts radiation emitted by the active layer into radiation of another wavelength. The conversion layer may be configured such that full conversion takes place. Full conversion is in particular understood to mean that the conversion layer converts the majority of the radiation emitted by the active layer into radiation of another wavelength such that the chip emits substantially only converted radiation. Alternatively, partial conversion takes place. Partial conversion should in particular be understood to mean that the conversion layer is configured such that only some of the radiation emitted by the active layer is converted into radiation of another wavelength such that the chip emits mixed radiation consisting of converted radiation and radiation emitted by the active layer.

The conversion layer has a refractive index different from the potting material. The refractive index of the conversion layer is preferably adapted to the refractive index of the semiconductor material. This means that the refractive index of the conversion layer is approximated to the refractive index of the semiconductor body. The difference between the refractive index of the conversion layer and the refractive index of the semiconductor body is as small as possible, preferably less than 10%. At the boundary surface between the potting material and the conversion layer, Fresnel reflections thus likewise arise, whereby reflected light is reflected back into the semiconductor body, reflected there at the mirror layer and then coupled out via the major face.

The semiconductor chip may be an LED, preferably a thin-film LED. An LED is regarded herein as a thin film LED if, during production thereof, the growth substrate on which the semiconductor body was grown epitaxially has preferably been completely detached.

The semiconductor body, in particular the semiconductor material, is preferably based on InGaN, InGaAlP or InAlGaAs.

The semiconductor chip need not comprise any potting material. In this case, the conversion layer is bonded directly to the semiconductor body, for example, by direct bonding of semiconductor body and conversion layer.

The outcoupling face has a lateral extent 100 nm to 100 µm. The lateral extent of the outcoupling face preferably is 2 µm to 10 µm.

A display may comprise a plurality of above-stated semiconductor chips arranged laterally next to one another. The semiconductor chips are, for example, arranged laterally next to one another on a common carrier substrate. The semiconductor chips are preferably arranged next to one another without spacing. Alternatively, regions may be arranged between the semiconductor chips whose active layer is not energised in operation such that in these regions no radiation is generated in operation.

The features mentioned in relation to the semiconductor chip also apply for the display and vice versa.

A display comprising such semiconductor chips is distinguished in particular by an elevated contrast. This elevated contrast may be achieved in that the individual semiconductor chips of the display in each case have an emission pattern with the preferred direction in the forward direction such that only at most a small proportion of the emitted radiation is coupled into a neighbouring semiconductor chip and outcoupled there.

The plurality of semiconductor chips of the display may comprise a common semiconductor body. The semiconductor body here comprises an active layer which comprises laterally spaced regions energized in operation. Between the regions of the active layer energized in operation, in each case one region is arranged in which the semiconductor body contains semiconductor material which is not energized in operation.

The energized regions of the active layer and the outcoupling faces of neighboring semiconductor chips may each be arranged at a lateral distance from one another. An outcoupling face is preferably arranged in each case symmetrically vertically above in each case an energized active layer.

A recess may be arranged in each case between the potting materials of neighboring semiconductor chips, which recess preferably comprises a gas with a refractive index of approximately 1. In this case, each semiconductor chip or each region of a semiconductor chip comprises a potting material, wherein no potting material is arranged on the semiconductor material in regions between the individual semiconductor chips, but instead the gas is enclosed in this region.

An absorber layer may be arranged in each case on the side of the active layer remote from the potting material between the regions of the active layer of neighboring semiconductor chips energized in operation. The semiconductor body thus comprises absorber material integrated between the energized regions of the active layer, this material being absorbing the radiation emitted by the energized regions of the active layer. The absorber layer and the gas-filled recess are here arranged vertically one above the other, semiconductor material of the semiconductor body being arranged between the absorber layer and the recess. This semiconductor material is not energized in operation. The recess and the absorber layer advantageously eliminate emitted light emitted by a semiconductor chip in the direction of a neighboring semiconductor chip. The rays emitted in the direction of the neighboring chip are totally reflected at the recess as a result of the significant jump in refractive index between semiconductor material and gas and are then absorbed in the absorber layer. These rays can thereby advantageously no longer be coupled out of the neighboring chips such that the contrast of such displays is advantageously increased.

The conversion layer may comprise a plurality of regions that convert radiation emitted by the active layer into radiation of a different wavelength. In plan view onto the conversion layer, the latter accordingly comprises a plurality of regions that convert radiation emitted by the active layer into radiation of differing wavelengths. For example, a first region may be configured such that the radiation emitted by the active layer is converted into red radiation, a second region is configured such that the radiation emitted by the active layer is converted into green radiation and a third region is configured to allow the radiation to pass unchanged or convert it into yellow radiation.

A region of the conversion layer is preferably in each case arranged downstream of a semiconductor chip such that in plan view onto the display a matrix-like arrangement of the different regions of the conversion layer is formed, for example.

By introducing a conversion layer into the beam path of the semiconductor chip, the color of emission of the radiation emitted by the chip may be modified. In particular, a conversion layer with differently colored regions may ensure that a full color display is achieved. In this way, for example, an RGB (Red, Green, Blue) display may be obtained. White converted displays are additionally used in pixelated headlamps.

A method of producing a semiconductor chip comprises the following method steps:

providing a semiconductor body of semiconductor material, which comprises an active layer that generates radiation, and arranging a mirror layer on the semiconductor body, wherein the gap between the active layer and the mirror layer is set such that radiation emitted by the active layer towards an outcoupling face interferes with radiation reflected at the mirror layer such that an emission pattern of the emitted radiation of the semiconductor chip is generated with a preferred direction in the forward direction.

The method may comprise the further method step:

arranging a potting material on the semiconductor body on the side remote from the mirror layer, which material has a refractive index lower than the refractive index of the semiconductor material.

The features mentioned in relation to the semiconductor chip also apply to the method and vice versa.

A display may be produced which comprises a plurality of semiconductor chip's produced using the methods stated above.

Further advantages are revealed by the examples described below in conjunction with FIGS. 1 to 5.

In the figures, identical or identically acting components may in each case be provided with the same reference numerals. The components illustrated and their size ratios to one another should not be viewed as being to scale. Rather, individual elements such as, for example, layers, patterns, components and regions are shown exaggeratedly thick or large for greater ease of depletion and/or better comprehension.

FIG. 1 shows a semiconductor chip 100 comprising a semiconductor body 6 and a potting material 7 arranged thereon. The semiconductor chip 100 is, for example, an LED, preferably a thin-film LED.

The semiconductor body 6 is made of semiconductor material, for example, based on InGaN, InGaAlP, InAlGaAs. The semiconductor body comprises an active layer 2 that generates radiation and is energized when in operation. The part of the active layer to be energized when in operation here does not extend over the entire lateral extent of the semiconductor body 6, but rather is arranged in a centered manner in the semiconductor layers of the semiconductor body 6. This means that, in plan view onto the semiconductor chip 100, the semiconductor body comprises a central region which is energized when in operation, in which radiation is generated, neighboring peripheral regions of the chip 100 not being energized when in operation.

The semiconductor body 6 comprises epitaxially deposited layers which form the semiconductor body, the active layer 2 being integrated into these layers.

The semiconductor body 6 comprises a major face on which potting material 7 is arranged. A mirror layer 1 is arranged on the side of the semiconductor body 6 remote from the potting material 7.

The potting material has a refractive index lower than the refractive index of the semiconductor material of the semiconductor body 6. The potting material contains silicone, for example. The potting material is arranged as a layer on the major face of the semiconductor body 6. The side faces of the semiconductor body 6 are preferably free of potting material 7.

The mirror layer 1 emits the radiation emitted by the active layer 2 in the direction of the major face. Light leaving the semiconductor chip 100 is then coupled out directly from the active layer 2 towards the major face (see beam path, arrow 3) or with indirect reflection by the mirror layer 1 (see beam path, arrow 4). This direct light 3 and reflected light 4 produce an interference image as a function of the gap $d_3$ between the active layer 2 and the mirror layer 1. This effect modifies the internal emission pattern of the semiconductor chip 100. To increase the efficiency and contrast of such a semiconductor chip 100, the initially Lambertian emission of the semiconductor chip is directed more strongly in the forward direction. This effect is also known as "beam shaping". This is specifically achieved in that the gap $d_3$ between the mirror layer 1 and the active layer 2 is selected such that the emission intensity in the forward direction is amplified, preferably reaches its maximum, through resonance.

In this way, the semiconductor chip 100 advantageously comprises an outcoupling face 9 from which the majority of the radiation emitted in the active layer 2 is coupled out of the semiconductor chip, this outcoupling face 9 preferably comprising a smaller lateral extent than that of the semiconductor body 6. The outcoupling face 9 is arranged centered in the semiconductor chip 100 such that in plan view onto the semiconductor chip, the semiconductor chip 100 comprises the outcoupling face 9 in the central region, the face being adjoined by regions 10 from which hardly any or no radiation is coupled out of the semiconductor chip.

If the energized active layer has a half value $p_1$, the ideal minimum half value of the associated outcoupling face $p_2$ may then be calculated using the following formula:

$$p_2 = p_1 * (d_1 - d_3) * \tan(a\sin(n_2 n_1)) + d_2 * \tan(\alpha_2).$$

wherein $d_1$ is the height of the semiconductor body 6, $d_2$ the height of the potting material 7, $d_3$ the gap between the active layer 2 and the mirror layer 1, $n_1$ the refractive index of the semiconductor material and $n_2$ the retractive index of the potting material 7, wherein $\alpha_2$ is 0 to 90° or 20° to 60°.

The gap $d_3$ amounts, for example, to 50 nm to 130 mm or 75 nm to 105 nm. In particular, the gap $d_3$ is 0.5 $n_1\lambda$, wherein $\lambda$ is a main wavelength emitted by the semiconductor chip. The refractive index $n_1$ may, for example, be 2.2 to 2.7 and the refractive index $n_2$, for example, 1.3 to 1.75.

On the side of the potting material 7 remote from the semiconductor body 6 a conversion layer 8 is arranged which converts the radiation emitted by the active layer 2 into radiation of another wavelength. The conversion layer here has a refractive index conformed to the refractive index of the semiconductor material, i.e., for example, the refractive index $n_1$.

Fresnel reflections occur at the boundary surfaces between, the semiconductor material 6 and the potting material 7 and between the potting material 7 and the conversion layer 8 such that reflected light passes back into the semiconductor body 6 and there is reflected at the mirror layer 1 towards the outcoupling face.

To increase the beam shaping effect in the case of such a semiconductor chip 100, a Bragg mirror 11 may optionally be integrated between the active layer 2 and the outcoupling face 9 in the semiconductor body 6. The Bragg mirror 11 comprises, for example, five $\lambda/4$ layers of $Al_xGa_{(1-x)}N$ and GaN.

The outcoupling face 9, the Bragg mirror 11 and the active layer 2 are here preferably arranged centered in the semiconductor chip 100.

By controlling the gap d3 within the semiconductor chip 100 the emission pattern of such a chip has increased efficiency and improved contrast compared with conventional chips. The contrast is here, the ratio of the radiation emitted in operation from the outcoupling face 9 and the radiation emitted in operation from neighboring regions 10. In neighboring regions 10 little or no radiation is in this case coupled out of the semiconductor chip 100.

The lateral extent of the outcoupling face 9 may be 100 nm to 100 µm, preferably 2 µm to 10 µm.

The semiconductor chip 100 may be used in a full color display or indeed for pixelated headlamps.

FIG. 2A shows a diagram in which the efficiency of the overall emission from the outcoupling face is plotted as a function of the gap $d_3$. This diagram relates, for example, to a semiconductor chip 100 according to the example of FIG. 1.

The curve $A_1$ of FIG. 2A shows that outcoupling efficiency out of the outcoupling face is directly dependent on the gap between the active layer and the mirror layer. In particular, the outcoupling efficiency has a maximum value at a gap of 90 nm, preferably with a tolerance of at most 10% or of at most 5%. Above and below this ideal gap outcoupling efficiency from the outcoupling face decreases. This means that in the ranges above and below a gap of 90 nm, a proportion of the radiation emitted by the active layer is coupled out in regions neighboring the outcoupling face. However, this radiation disadvantageously reduces the contrast of such chips, which is especially disadvantageous in display applications.

Curve $A_1$ shows a semiconductor chip 100 according to the example of FIG. 1, but with no Bragg mirror arranged between the active layer and the outcoupling face. A data point which relates to a semiconductor chip with a Bragg mirror between the active layer and the outcoupling face is shown in the diagram of FIG. 2A by the point $B_1$. As shown in the diagram, the outcoupling efficiency in the region of the outcoupling face can be further increased using a Bragg mirror arranged in this way. The "beam shaping effect" increases in this way, in particular.

FIG. 2B shows a diagram in which the contrast, i.e. the proportion of total power in regions neighboring the outcoupling face, is plotted against the gap $d_3$ between the active layer and the mirror layer. As is clear from the curve $A_2$, the contrast advantageously increases at a greater gap $d_3$.

The curve $A_2$ of the diagram of FIG. 2B relates in turn to a semiconductor chip according to the example of FIG. 1 in which, however, no Bragg mirror is integrated into the semiconductor body. A semiconductor chip integrated with a Bragg mirror and an associated data point is shown at point $B_2$. A semiconductor chip with an integrated Bragg mirror here exhibits average contrast.

FIG. 2C shows a diagram in which radiant intensity is plotted against emission angle, wherein the individual curves $A_3$ to $A_7$ have different spacings $d_3$ between the active layer and the mirror layer. The curves $A_3$ to $A_7$ are based on semiconductor chips without an integrated Bragg mirror, while the curve $B_3$ is based on a semiconductor chip with integrated Bragg mirror. The curve $A_3$ is based on a gap $d_3$ of 100 nm, the curve $A_4$ on one of 90 nm, the curve $A_5$ on one of 80 nm, the curve $A_6$ on one of 70 nm and the curve $A_7$ on one of 110 nm. The curves with a large gap between the active layer and the mirror layer, i.e. the curves $A_3$ and $A_4$, feature low efficiency at an angle of 0°. The curves $A_6$ and $A_5$, on the other hand, feature high efficiency at 0°. With such gaps, an emission pattern thus arises with a preferred direction in the forward direction, i.e. in the direction of 0°.

High efficiency may also be achieved with a chip with integrated Bragg mirror, see curve $B_3$.

FIG. 3 shows a display 1000 comprising a plurality of semiconductor chips 100 arranged laterally next to one another. The semiconductor chips 100 correspond substantially to the semiconductor chip according to the example of FIG. 1, no Bragg mirrors being integrated Into the semiconductor body 6 in the case of the chips of FIG. 3.

The semiconductor chips 100 of the display 1000 comprise a common semiconductor body 6. This means that the semiconductor chips 100 have been grown jointly as a composite structure onto a growth substrate. In this case, at least one active layer is formed in the composite structure which comprises regions energized when in operation. Between the regions of the active layer energized when in operation, in each case a lateral gap is arranged such that the composite structure comprises regions which do not generate any radiation when in operation.

The display 1000 comprises a plurality of outcoupling faces 9, 10, each arranged at a lateral distance from one another. An outcoupling face is arranged vertically downstream of each active layer. The display is thus designed to comprise regions 9, 10 from which radiation is emitted in operation, the regions being separated from one another by regions in which no radiation is emitted in operation.

To ensure maximum, contrast of such displays, it is advantageous to prevent emitted radiation of one semiconductor chip from being coupled into a neighboring semiconductor chip. To this end, the gap between the active layer 2 and the mirror layer 1 of each semiconductor chip 100 is in each case optimally set, as set out in the example of FIG. 1. To nevertheless eliminate radiation emitted into a neighboring semiconductor chip and thereby further to increase the contrast of such displays, a recess 12 filled with gas may be arranged between the semiconductor chips in the potting material 7 and an absorber layer 13 may be arranged in the semiconductor body 6 between the regions of the active layer 2 energized in operation. The rays 14 emitted in the direction of the neighboring semiconductor chip are totally reflected at the recess 12 as a result of the significant jump in refractive index between semiconductor material and gas and are absorbed in the absorber layer 13. These rays can thereby no longer be coupled out of neighboring semiconductor chips, whereby the contrast of such displays is advantageously increased.

To this end, the absorber layer 13 and the recess 12 are arranged vertically one above the other. The absorber layer 13 may here be arranged directly adjacent the mirror layer 1 in the semiconductor body 6.

Otherwise, the example of FIG. 3 corresponds to the example of FIG. 1 with regard to the semiconductor chips 100.

The example of the display in FIG. 4 differs from the example of FIG. 3 in that no potting material is arranged on the semiconductor body. The display comprises the conversion layer 8 directly on the semiconductor body 6, the conversion layer being patterned. The conversion layer 8 of the display 1000 comprises a plurality of regions $K_1$, $K_2$ that convert radiation emitted by the active layer 2 into radiation of a different wavelength. In particular, a plurality of conversion regions is arranged above the outcoupling face 9 which are separated from one another by means of a gap. The gap contains air, for example. A region of the conversion layer is here arranged downstream of each region of the active layer 2 to be energized in operation. Each region preferably emits a differently converted wavelength in comparison with the other regions such that advantageously, for example, an RGB display 1000 may be obtained.

Otherwise, the example of FIG. 4 corresponds substantially to the example of FIG. 3.

FIG. 5 shows a flow chart for the production of a semiconductor chip, for example, according to the example of FIG. 1. In method step $V_1$, a semiconductor body consisting of semiconductor material is provided which comprises an active layer that generates radiation. Then, in method step $V_2$, a mirror layer is arranged on the semiconductor body. In this case, the gap between the active layer and the mirror layer is set such that radiation emitted by the active layer towards an outcoupling face of the semiconductor body interferes with radiation reflected in the mirror layer such that an emission pattern of the emitted radiation of the semiconductor chip is generated with a preferred direction in the forward direction.

Then, in method step $V_3$, a potting material is applied to the side of the semiconductor body remote from the mirror layer, the potting material having a lower refractive index than the refractive index of the semiconductor material.

Our chips, displays and methods are not limited to the examples as a result of the description made with reference thereto, but instead this disclosure encompasses any novel feature and any combination of features, including in particular any combination of features in the appended claims, even if the features or combinations are not themselves explicitly indicated in the claims or examples.

The invention claimed is:

1. An optoelectronic semiconductor chip comprising a semiconductor body of semiconductor material, an outcoupling face arranged downstream of the semiconductor body in an emission direction and a mirror layer, wherein
   the semiconductor body comprises an active layer that generates radiation,
   the mirror layer is arranged on the side of the semiconductor body remote from the outcoupling face,
   a gap between the active layer and the mirror layer is set such that radiation emitted by the active layer towards the outcoupling face interferes with radiation reflected at the mirror layer such that the semiconductor chip features an emitted radiation pattern with a selected direction in the emission direction, and
   Formula (1) is satisfied:

$$p_2 = p_1 * (d_1 - d_3) * \tan(a \sin(n_2/n_1)) + d_2 * \tan(\alpha_2) \quad (1)$$

wherein $p_1$ is a half value of the energized active layer, $p_2$ is a half value of the outcoupling face, $d_1$ is the height of the semiconductor body, $d_2$ is the height of the potting material, $d_3$ is a gap between the active layer and the mirror layer, $n_1$ is a refractive index of the semiconductor material and $n_2$ is a refractive index of the potting material, with $0 \leq \alpha_2 < 90°$.

2. The semiconductor chip according to claim 1, wherein the outcoupling face has a lateral extent which is less than a lateral extent of the semiconductor body, and the gap between the active layer and the mirror layer is 90 nm, with a tolerance of at most 10%.

3. The semiconductor chip according to claim 1, further comprising a potting material arranged on the semiconductor body which has a refractive index less than the refractive index of the semiconductor material.

4. The semiconductor chip according to claim 1, further comprising a Bragg mirror arranged between the active layer and the outcoupling face.

5. The semiconductor chip according to claim 4, wherein the Bragg mirror comprises $Al_xGa_{(1-x)}N$ and GaN layers.

6. The semiconductor chip according to claim 3, further comprising a conversion layer applied to the side of the potting material remote from the semiconductor body or to the semiconductor body.

7. A display comprising a plurality of the optoelectronic semiconductor chips according to claim 1, laterally arranged next to one another.

8. The display according to claim 7, wherein the plurality of semiconductor chips comprises a common semiconductor body.

9. The display according to claim 8, wherein regions of the active layer energized in operation and the outcoupling faces of neighboring semiconductor chips are arranged at a lateral distance from one another.

10. The display according to claim 7, wherein a potting material is arranged on the semiconductor bodies of the semiconductor chips, the potting material has a refractive index less than the refractive index of the semiconductor material, and a recess filled with gas is arranged between the potting materials of neighboring semiconductor chips.

11. The display according to claim 7, wherein a potting material is arranged on the semiconductor bodies of the semiconductor chips, the potting material has a refractive index less than the refractive index of the semiconductor material, and an absorber layer is arranged on a side of the active layer remote from the potting material between the regions of the active layer of neighboring semiconductor chips energized in operation.

12. The display according to claim 7, wherein a potting material is arranged on the semiconductor bodies of the semiconductor chips, the potting material has a refractive index less than the refractive index of the semiconductor material, and a conversion layer is applied to the side of the potting material remote from the semiconductor body, the conversion layer comprises a plurality of regions that convert radiation emitted by the active layer into radiation of a different wavelength.

13. An optoelectronic semiconductor chip comprising a semiconductor body of semiconductor material, an outcoupling face arranged downstream of the semiconductor body in an emission direction and a mirror layer, wherein
   the semiconductor body comprises an active layer that generates radiation,
   the mirror layer is arranged on the side of the semiconductor body remote from the outcoupling face,
   a gap between the active layer and the mirror layer is set such that radiation emitted by the active layer towards the outcoupling face interferes with radiation reflected at the mirror layer such that the semiconductor chip features an emitted radiation pattern with a selected direction in the emission direction, and
   Formula (1) is satisfied:

$$p_2 = p_1 + (d_1 - d_3) * \tan(a \sin(n_2/n_1)) + d_2 * \tan(\alpha_2) \quad (1)$$

wherein $p_1$ is a half value of the energized active layer, $p_2$ is a half value of the outcoupling face, $d_1$ is the height of the semiconductor body, $d_2$ is the height of the potting material, $d_3$ is a gap between the active layer and the mirror layer, $n_1$ is a refractive index of the semiconductor material and $n_2$ is a refractive index of the potting material, with $0 \leq \alpha_2 < 90°$.

* * * * *

UNITED STATES PATENT AND TRADEMARK OFFICE
CERTIFICATE OF CORRECTION

PATENT NO.        : 9,112,089 B2
APPLICATION NO.   : 14/008638
DATED             : August 18, 2015
INVENTOR(S)       : von Malm et al.

It is certified that error appears in the above-identified patent and that said Letters Patent is hereby corrected as shown below:

In the claims,

In Column 11

At line 20, please change "*tan(a sin" to --*tan(asin--.

In Column 12

At line 43, please change "*tan(a sin" to --*tan(asin--.

Signed and Sealed this
Twenty-third Day of August, 2016

Michelle K. Lee
*Director of the United States Patent and Trademark Office*